(12) United States Patent
Yang et al.

(10) Patent No.: US 6,627,526 B1
(45) Date of Patent: Sep. 30, 2003

(54) METHOD FOR FABRICATING A CONDUCTIVE STRUCTURE FOR A SEMICONDUCTOR DEVICE

(75) Inventors: Wenge Yang, Fremont, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/805,287

(22) Filed: Mar. 13, 2001

Related U.S. Application Data
(60) Provisional application No. 60/234,523, filed on Sep. 21, 2000, and provisional application No. 60/234,522, filed on Sep. 21, 2000.

(51) Int. Cl.[7] .................. H01L 21/3205; H01L 21/4763
(52) U.S. Cl. ............. 438/592; 438/588; 438/618; 438/628; 438/644; 438/652; 438/654
(58) Field of Search .................. 438/618, 625, 438/628, 629, 642, 644, 652, 654, 623, 624, 588, 592; 257/751, 753

(56) References Cited

U.S. PATENT DOCUMENTS 4,650,696 A * 3/1987 Raby .................... 438/654
5,846,881 A * 12/1998 Sandhu et al. ........... 438/683
5,940,735 A * 8/1999 Mehta et al. ............. 438/783
6,066,533 A * 5/2000 Yu ......................... 438/275
6,245,674 B1 * 6/2001 Sandhu .................... 438/674
6,274,483 B1 * 8/2001 Chang et al. ............. 438/640

OTHER PUBLICATIONS

Sakamoto et al. "Limitation of Sputtered Adhesion Layer Thickness", 1991, IEEE, pp. 338–340.*

* cited by examiner

Primary Examiner—Amir Zarabian
Assistant Examiner—Maria Guerrero
(74) Attorney, Agent, or Firm—Wagner, Murabito & Hao LLP

(57) ABSTRACT

A process for making semiconductor structures, and the resulting highly conductive semiconductor structures, includes using damascene process to form a structure with a thin adhesive layer and overlaying conductive layer. The highly conductive semiconductor structure has a thickness less than about 3000 Å, preferably less than about 2600 Å, and incorporates an adhesive layer that is preferably less than about 100 Å thick. Despite the reduced profile and topography of the structure, it is more conductive than prior structures, and provides a robust device.

14 Claims, 7 Drawing Sheets

METHOD FOR FABRICATING A CONDUCTIVE STRUCTURE FOR A SEMICONDUCTOR DEVICE

RELATED APPLICATIONS

This application claims priority to U.S. Provisional Application Serial No. 60/234,523, filed Sep. 21, 2000, and is related to U.S. Provisional Application Serial No. 60/234,522, filed Sep. 21, 2000, entitled "HIGHLY CONDUCTIVE SEMICONDUTOR STRUCTURES, METHOD OF FORMING SAME VIA PLASMA ETCH, AND ELECTRICAL DEVICES INCORPORATING HIGHLY CONDUCTIVE SEMICONDUTOR STRUCTURES". hereby incorporated by reference.

BACKGROUND

This invention is directed to improved semiconductor devices, and in particular is directed to highly conductive semiconductor structures, such as those formed of tungsten or tungsten silicide, with reduced topographic profiles, and electrical devices incorporating same.

Tungsten (W) or Tungsten silicide (WSi) have desirable conductive and other properties making them useful in forming semiconductor structures, especially bit-line gates. In the past, due to the lack of a sufficiently selective etch process, the process illustrated in FIGS. 1 and 2 was utilized. A layer of tungsten or tungsten silicide 101 was deposited over a layer of polysilicon 102 (also referred to as poly or polySi), which was previously deposited on the substrate 103. Substrate 103 could be an oxide, for example silicon oxide-silicon nitride-silicon oxide (also referred to as ONO), itself on a silicon substrate. The polysilicon layer 102 improved the etch process window during etching of the conductive layer, and also enhanced the adhesion of the W or WSi to the substrate.

With reference to FIG. 2 following etching, the resulting conductive structure consists of an upper conductive layer 101a and an intermediate "adhesive" layer 102a on top of substrate 103. If layer 101 a is formed of W, and the conductive structure forms a structure such as a bit-line gate, generally the W layer must have a thickness between about 800–2500 angstroms (Å) to be sufficiently conductive to accomplish the desired function. Generally, the intermediate or adhesive layer 102a must be at least 1000 Å to achieve optimal etching. Generally, such previous structures have a thickness greater than about 3000 Å.

However, the resulting structure of a conductive material on top of a polysilicon layer has a higher electrical resistance than desired due to the lower conductivity of the polysilicon with respect to the conductive layer, and further the structure is taller or thicker than desired, increasing the topography of the overall device, making any subsequent processing steps more difficult.

It is thus desired to have more highly conductive semiconductor structures. A highly conductive semiconductor structure is defined herein as a structure which has a conductive layer adhered to a substrate by an intermediate adhesive layer, wherein the adhesive layer is conductive but less conductive than the conductive layer, and the conductivity of the overall structure (i.e., the conductive layer and adhesive layer) is higher than previous conductive semiconductor structures formed of a conductive layer and an adhesive layer. In order to reduce electrical resistance, it is necessary to increase the thickness of the conductive layer and/or reduce the thickness of the adhesive layer. However, due to the deficiencies of prior art etch processes, it was not possible to decrease the thickness of the adhesive layer below about 1000 Å, and increasing the thickness of the overlying conductive layer was undesirable as this would increase the topography (vertical profile), cost, and overall size of the resulting structure and devices incorporating same. In view of the need for smaller devices, it desirable to reduce the size and increase the conductivity (reduce electrical resistance) of semiconductor structures, and the resulting semiconductor devices and electrical devices incorporating same.

Therefore, there is a need for highly conductive semiconductor structures that have a lower profile with respect to the underlying substrate than previous structures. There is also a need for an improved process of making such structures.

BRIEF SUMMARY

In one aspect the present invention is directed to a low profile conductive structure on a semiconductor device that also has reduced electrical resistance with respect to previous structures designed to perform the same function. In one embodiment, the present invention is directed to a highly conductive semiconductor structure having a conductive layer of W or WSi and having a reduced topography or vertical profile with respect to prior semiconductor structures having a W or WSi conductive layer, yet having lower resistance than such prior structures. In a preferred embodiment of the present invention the conductive layer of the highly conductive structure is formed of W or WSi, and the intermediate layer or adhesive layer is of polysilicon, and the overall structure thickness (i.e., projecting out from the semiconductor substrate) is less than about 3000 Å, yet the conductive structure is thick enough to accomplish the desired function. In alternative preferred embodiments, the overall structure thickness is less than about 2600 Å or less than about 2000 Å, yet the structure is thick enough to accomplish the desired function. In a preferred embodiment the conductive layer is formed of W and has a thickness (i.e., vertically with respect to the underlying substrate) of approximately 2000 Å±500 Å. In a preferred embodiment the adhesive layer is conductive and at most about 100 Å thick, yet thick enough to provide firm adhesion of the conductive layer to the substrate, so that the resulting semiconductor structure will be robust enough to withstand subsequent processing to form a semiconductor device, installation in an electrical device, and use. In a preferred embodiment the adhesive layer has a thickness of between about 10 Å and about 100 Å, and is formed of polysilicon.

In another aspect, the present invention is directed to a new method for forming low profile highly conductive semiconductor structures, and semiconductor devices and electrical devices incorporating same. In a preferred embodiment, a single damascene etch process is used, in which a sacrificial (or mold) layer is deposited on a substrate, patterned in the desired configuration, followed by deposit of a thin adhesive layer, subsequently followed by depositing of the highly conductive layer. Chemical mechanical polishing (CMP) or other techniques are used to remove excess adhesive and conductive layers as desired in between deposition steps. Thereafter, the balance of the sacrificial layer is removed to yield the final product. In a preferred embodiment, the adhesive layer is electrically conductive yet provides for good bonding between typical substrates and more conductive materials, such as W and WSi.

The highly conductive semiconductor structures and semiconductor devices incorporating them are utilized to construct electronic devices. The semiconductor structure of the present invention may be incorporated into a semiconductor device, such as an integrated circuit, for example a memory cell, such as an SRAM, a DRAM, an EPROM, an EEPROM, non-volatile memory device, etc.; a programmable logic device; a data communications device; a clock generation device; etc. Furthermore, any of these semiconductor devices may be incorporated in an electronic device (which term includes an electromechanical device) for example a computer, an airplane, a camera, a television, a mobile telephone, or an automobile.

DETAILED DESCRIPTION

Figure 1:
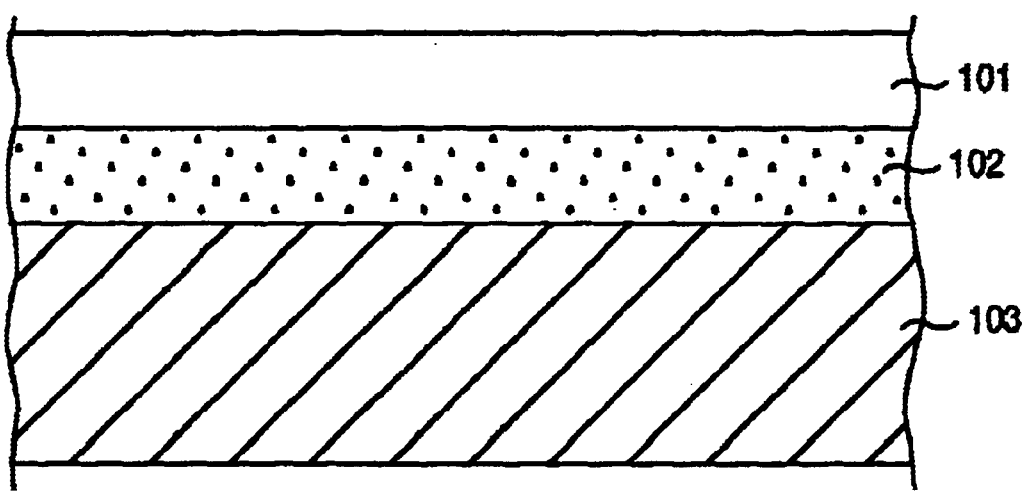
FIG. 1 depicts a cross-sectional view of a more conductive layer bound by an adhesive layer (also electrically conductive but less so) to a substrate.
Figure 2:
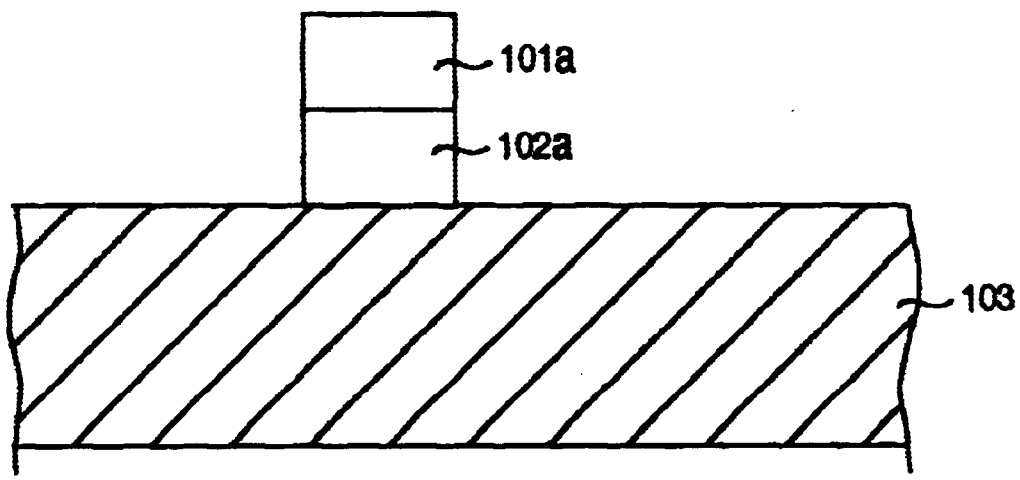
FIG. 2 depicts a cross-sectional view of a prior art electrically conductive structure on a semiconductor device.
Figure 3:
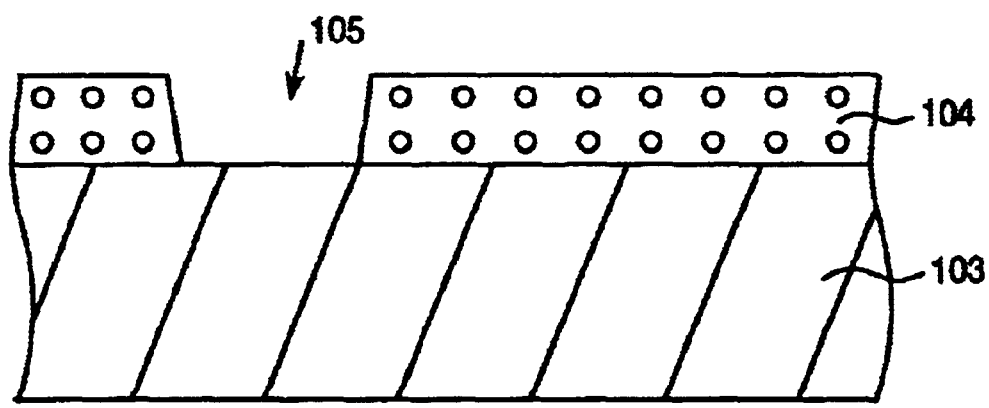
FIG. 3 depicts a cross-sectional view of a layer of a hard mask material, or sacrificial layer, deposited upon a substrate, and patterned.

Referring to FIG. 3, according to one exemplary embodiment of the present invention, a layer 104 is provided on a substrate 103. Layer 104 is preferably a hard mask material that can be patterned or etched selectively with respect to substrate 103 to form a trench, via or hole, such as 105. Although the sides of trench 105 are shown slightly sloped in FIG. 3, in a preferred embodiment they are more vertical (i.e., perpendicular to the surface of the substrate), and can be produced using techniques such as that shown in U.S. Pat. No. 5,893,748, assigned to Advanced Micro Devices, Inc. For additional information on methods of fabricating semiconductor structures by damascene, such as bit-lines, see U.S. Pat. No. 6,071,804 to Gau.

Figure 4:
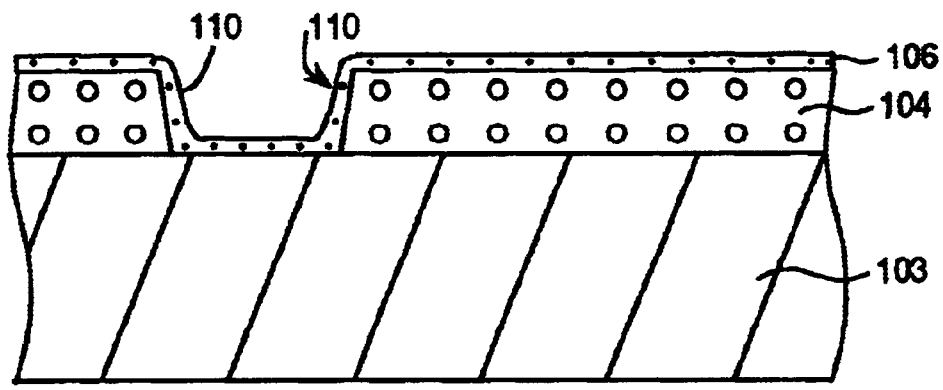
FIG. 4 depicts a cross-sectional view of the structure of FIG. 3 following deposition of an adhesive layer.

With reference to FIG. 4, an adhesive layer 106 is applied over layer 104 and fills in trench 105. In the illustration of FIG. 4, the walls of trench 105 are illustrated as having a less than perpendicular relationship with the top surface of substrate 103. In a preferred embodiment the vertical walls of trench 105 form a 90° angle with the top of substrate 103 or as close thereto as possible. Thus, while in FIG. 4 adhesive layer has an inverted crescent shape within trench 105, preferably the sides 110 are as thin as possible, or non-existent.

Adhesive layer 106 must be formed of a conductive material yet also form a good bond to typical substrate materials such as $SiO_2$ or oxide-nitride-oxide substrates commonly used (e.g., silicon oxide—silicon nitride—silicon oxide, otherwise known as ONO). A preferred adhesive is polysilicon, which may be deposited, for example, by CVD.

Preferably adhesive layer 106 is approximately 100 Å in thickness or less, although in less preferred embodiments the adhesive layer may be between about 100 Å and 500 Å in thickness. Preferably, the adhesive layer 106 is always less than about 1000 Å in thickness. The minimum thickness of the adhesive layer is that thickness which is required to provide sufficient adhesion between the substrate and conductive layer for a robust structure, which can withstand subsequent processing into a semiconductor device, testing, incorporation into an electrical device, and usage of the electrical device. The minimum thickness of the adhesive layer will also depend on the material used, the deposition or application process, and polishing or etching applied thereto. Thus the term "an adhesive layer less than (or not more than) about 100 Å (or 500 Å) in thickness" is defined to include a layer of adhesive sufficiently thick to provide sufficient adhesion between the substrate and conductive layer to accomplish the present invention.

Figure 5:
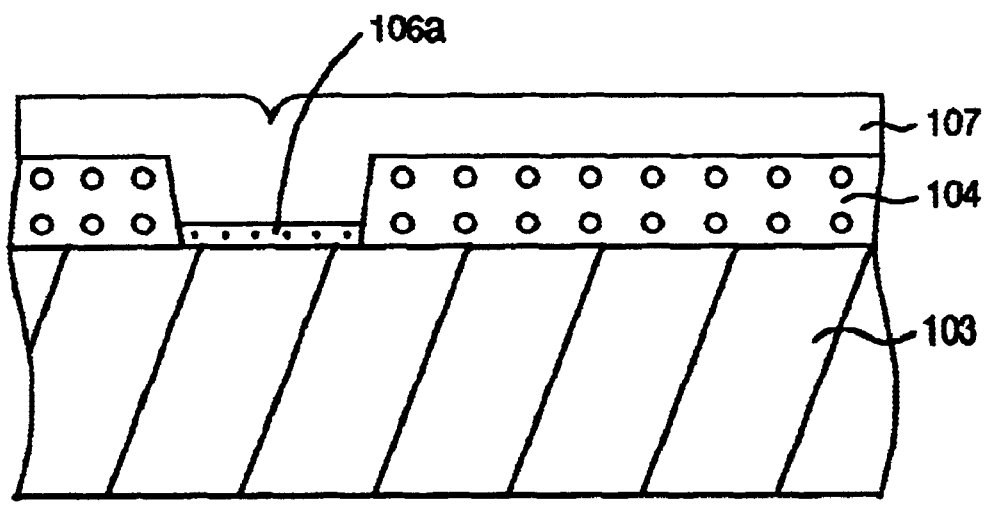
FIG. 5 is a cross-sectional view of the structure of FIG. 4 following deposit of an electrically conductive layer.

With reference to FIG. 5, excess adhesive layer 106 has been removed leaving a reduced adhesive layer 106a at the bottom of trench 105. The removal process, also called planarization, can be accomplished by conventional planarizing techniques, such as chemical mechanical polishing, or simple etching. Layer 106 may be present on layer 104, since in subsequent steps layer 104 will be removed. The term planarizing means to remove material, generally in the vertical direction, enhancing the flatness or reducing the vertical topography of a structure being planarized.

A layer of more highly conductive material 107 is deposited over the top of adhesive layer 106a in trench 105, filling trench 105 and overlapping hard mask material 104. Preferred conductive materials include W, WSi and other materials having high conductivity and meeting the requirements of the resulting semiconductor device.

With regard to techniques for depositing adhesive layer 106 and highly conductive layer 107, conventional methods such as chemical vapor deposition (CVD) may be used. Conventional deposition, patterning, layer removal and/or polishing techniques that may be used with the present invention are well known to those of ordinary skill in the art, and are also described in Encyclopedia of Chemical Technology, Kirk-Othmer, Volume 14, pp. 677–709 (1995); Semiconductor Device Fundamentals, Robert F. Pierret, Addison-Wesley (1996); and Microchip Fabrication, $3^{rd}$ Edition, Peter Van Zant, McGraw-Hill (1997). Conventional chemical mechanical polishing is described in U.S. Pat. Nos. 4,789,648, 4,954,142, and 6,262,354.

Figure 6:
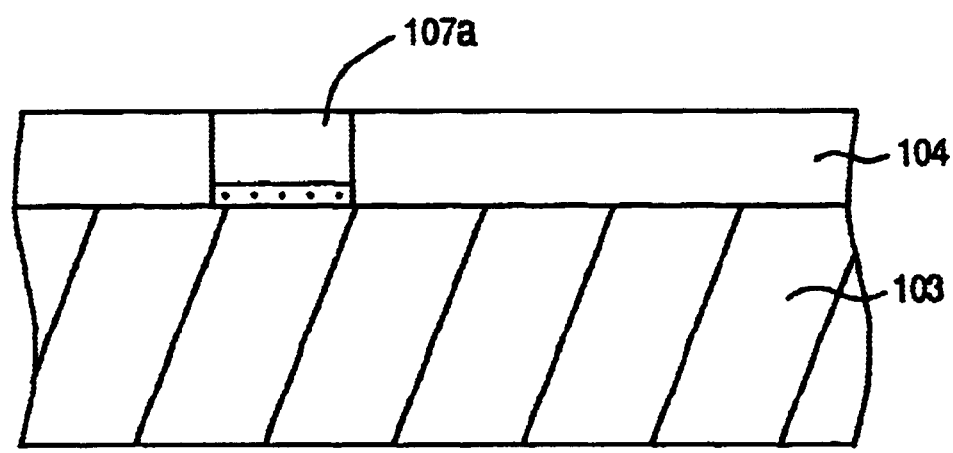
FIG. 6 is a cross-sectional view of the structure of FIG. 5 following removal of any excess of the electrically conductive material.

With regard to FIG. 6, excess conductive layer 107 has been removed leaving a reduced conductive layer 107a on reduced adhesive layer 106a within trench 105 and surrounded by hard mask material layer 104. Techniques used to remove adhesive layer 106 and highly conductive layer 107 are conventional techniques such as chemical mechanical polishing (CMP), with the processes being optimized for the particular adhesive material, e.g. polysilicon, or highly conductive material, e.g., W or WSi.

Figure 7:
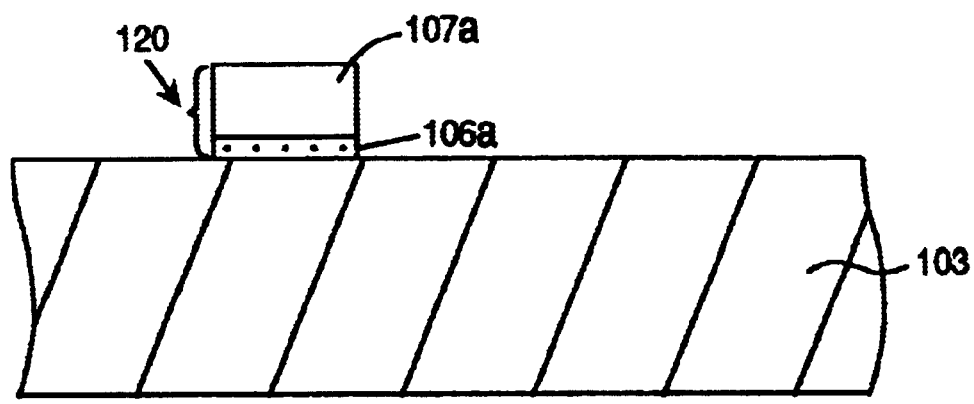
FIG. 7 is a cross-sectional view of the structure of FIG. 6 following removal of the remaining hard mask material, illustrating the cross-sectional view of the resulting low profile highly conductive semiconductor structure.

With reference to FIG. 7, the remaining mask layer 104 has been removed leaving highly conductive semiconductor structure 120 on substrate 103. In a preferred embodiment, the mask material is sufficiently different from the substrate material with respect to the particular etch or ablative technique to be used. For example, silicon nitride may be utilized in a preferred embodiment as the mask layer 104 on top of a substrate 103 formed of ONO.

Typical substrates useful herein include but are not limited to various oxides of silicon and aluminum (e.g., $SiO_2$, $Al_2O_3$), on a semiconductor substrate, such as silicon.

In a preferred embodiment, the thickness of structure 120 (i.e., the distance which structure 120 projects out from substrate 103) is less than approximately 3000 Å. In alternative embodiments, the thickness of structure 120 is less than about 2600 Å and preferably is between about 1500 Å and about 2500 Å. Thus for example, a bit-line gate can be formed of W or WSi using the foregoing process with the resulting bit-line gate having an average thickness of about 2000 Å, including an adhesive layer of approximately 100 Å or less in thickness. Semiconductor devices incorporating structures such as structure 120 will have reduced electrical resistance and provide a robust process module.

In a preferred embodiment a non-volatile memory is constructed utilizing a structure formed in accordance with the method of the present invention, wherein the conductive layer is formed of W or WSi, and has a thickness of approximately 2000 Å±500 Å. In alternative embodiments, the highly conductive semiconductor structures of the present invention are utilized to construct electronic devices, including but not limited to microprocessors, computers, automobiles, and cameras.

Structures of the present invention may increase the speed of the devices into which they are incorporated by up to two times or more. Further, due to their decreased size, the structures of the present invention make possible faster and more powerful electronic devices, which are smaller, use less power, and generate less heat.

Numerous modifications and variations of the present invention are possible in light of the above teachings. It is therefore to be understood that within the scope of the appended claims, the invention may be practiced otherwise than as specifically described herein.

What is claimed is:

1. A method for fabricating a composite trace for a semiconductor device comprising:

depositing a hard mask layer on a surface of a semiconductor device substrate;

forming an opening through said hard mask layer to expose a region of said semiconductor substrate;

forming a conductive adhesive layer with a thickness of less than 1000 Å on the exposed region of said semiconductor device substrate within said opening;

depositing a conductive material on adhesive layer, wherein said conductive material fills said opening and overlaps said hard mask layer, thereby coating said semiconductor device substrate;

planarizing the coated semiconductor device substrate, thereby removing the conductive layer from the hard mask layer; and removing the hard mask layer, thereby forming a projecting trace comprising the adhesive layer and a conductive layer.

2. The method of claim 1, wherein the adhesive layer comprises polysilicon.

3. The method of claim 1, wherein said conductive material comprises tungsten.

4. The method of claim 1, wherein said opening comprises a wall that forms a 90° angle with the surface of said semiconductor device substrate.

5. The method of claim 1, wherein said planarizing is done by chemical mechanical polishing.

6. The method of claim 1, wherein said hard mask layer comprises silicon nitride.

7. The method of claim 1, wherein said substrate comprises an oxide on silicon.

8. The method of claim 1, wherein the thickness of the adhesive layer is between about 100 Å and 500 Å.

9. The method of claim 1, wherein said semiconductor substrate comprises silicon.

10. The method of claim 8, wherein the thickness of the adhesive layer is less than 100 Å.

11. The method of claim 9, wherein said semiconductor substrate further comprises ONO.

12. The method of claim 1, wherein said projecting trace projects a distance of less than approximately 3000 Å above the surface of said semiconductor device substrate.

13. The method of claim 12, wherein said projecting trace projects a distance of less than approximately 2600 Å above the surface of said semiconductor device substrate.

14. The method of claim 13, wherein said projecting trace projects a distance between about 1500 Å and 2500 Å above the surface of said semiconductor device substrate.

* * * * *